US006671174B1

(12) United States Patent
Heidorn

(10) Patent No.: US 6,671,174 B1
(45) Date of Patent: Dec. 30, 2003

(54) 5-PIN SURFACE MOUNT CONTACTS AND BLOCK ASSEMBLY

(75) Inventor: Richard H. Heidorn, Huntley, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/227,905

(22) Filed: Aug. 26, 2002

(51) Int. Cl.[7] .................................................. H05K 7/20

(52) U.S. Cl. ........................ 361/715; 361/808; 361/833; 361/727; 361/785; 439/682; 439/590; 439/83

(58) Field of Search ................................ 361/715, 776, 361/808, 767, 833, 727; 439/682, 590, 83, 815, 785, 834, 824

(56) References Cited

U.S. PATENT DOCUMENTS 4,466,688 A * 8/1984 Singer, Jr. ................... 439/825
5,457,593 A * 10/1995 Glaser et al. ............... 361/119
5,653,601 A * 8/1997 Martucci et al. .............. 439/82
6,083,032 A * 7/2000 Daoud ........................ 439/374
6,382,989 B1 * 5/2002 Yu ............................. 439/83
6,560,126 B1 * 5/2003 Le et al. ..................... 361/826

* cited by examiner

*Primary Examiner*—Randy Gibson
*Assistant Examiner*—Hung Bui
(74) *Attorney, Agent, or Firm*—Mark W. Croll; Paul F. Donovan

(57) ABSTRACT

A surge protector block assembly includes a plurality of individual 5-pin housing units which are formed integrally together. Each of the plurality of individual housing units has a plurality of surface mountable socket contacts for receiving corresponding pins of a surge protector module. A single and/or multi-layer printed circuit board is provided with a plurality of solder pads. Each of the plurality of individual housing units is surface mounted onto the solder pads of the single and/or multi-layer printed circuit board for electrical connection to corresponding ones of the plurality of the socket contacts.

11 Claims, 3 Drawing Sheets

5-PIN SURFACE MOUNT CONTACTS AND BLOCK ASSEMBLY

BACKGROUND OF THE INVENTION

This invention relates generally to surge protection devices for protecting telecommunications related equipment from power and transient surges. More particularly, it relates to a surge protector block assembly formed of a plurality of individual 5-pin housing units each housing unit having surface mountable contacts for connecting electrically to conductive traces on a single and/or multi-layer printed circuit board via solder pads.

As is generally well-known to those skilled in the telecommunications industry, modern telecommunications equipment is susceptible to transient surges such as those caused by lightning strikes and other surges on the transmission lines. Thus, various arrangements of surge protector circuits are known in the prior art which have been provided for connecting to each pair of incoming telephone lines so as to be normally non-conductive but are rendered conductive when a high voltage surge exceeds a predetermined breakdown voltage (e.g., 250 V) for protecting the equipment. Each pair of incoming telephone lines includes a "tip" line and a "ring" line. Each of the tip and ring lines is typically connected to a conventional 5-pin surge protector module via a protector block. One of the five pins is connected to an incoming tip line. A second one of the five pins is connected to an incoming ring line. A third one of the five pins is connected to an outgoing tip line. A fourth one of the five pins is connected to an outgoing ring line. A fifth one is connected to a ground potential.

The traditional method for connecting a cable having a plurality of incoming tip and ring telephone lines to the protector block has been to manually wire-wrap each line to the proper pin on the protector block. In view of the large number of telephone lines coming into a building or plant, the wire-wrapping of each line is a very time-consuming process. There is known heretofore in the prior art a method for eliminating wire-wrapping for the protector block assemblies. This prior art method utilized a multi-layer printed circuit board having a plurality of sockets formed by through-holes that are plated with metal. A protector module is provided with a plurality of pins that are inserted into the corresponding sockets formed in the multi-layer printed circuit board.

However, this prior art technique suffers from a number of disadvantages. Firstly, the use of the plurality of sockets or plated through-holes in the multi-layer printed circuit board increases not only the space requirements (i.e., real estate) but also increases the labor and manufacturing costs involved in fabricating the plurality of sockets. Secondly, the use of the plurality of sockets in the multi-layer printed circuit board prevents the placement or routing of the conductive traces on the various layers thereof across the areas of where the sockets are located, thereby adversely affecting optimal utilization of the multi-layers. Thirdly, the through-holes being plated with metal cause high inductance at high frequencies which may affect negatively the operation of the electrical circuits.

In view of these problems, the inventors have developed a way of eliminating the need for wire-wrapping of the protector block assemblies but yet solves all of the problems encountered in the prior art method. This is achieved by the provision of a single and/or multi-layer printed circuit board having a plurality of solder pads for electrical connection to corresponding ones of a plurality of surface mountable socket contacts disposed within a surge protector block assembly.

SUMMARY OF THE INVENTION

Accordingly, it is a general object of the present invention to provide an improved surge protector block assembly which is relatively simple and economical to manufacture and assemble but yet overcomes all of the problems encountered in the prior art method.

It is an object of the present invention to provide an improved surge protector block assembly for use with a single and/or multi-layer printed circuit board which minimizes the use of board space and reduces undesired high inductance.

It is another object of the present invention to provide an improved surge protector block assembly which is adapted for surface mounting to a single and/or multi-layer printed circuit board.

It is still another object of the present invention to provide an improved surge protector block assembly which includes a plurality of individual 5-pin housing units each housing unit having surface mountable contacts for connecting electrically to conductive traces on a single and/or multi-layer printed circuit board via solder pads.

In a preferred embodiment of the present invention, there is provided a surge protector block assembly which includes a plurality of individual 5-pin housing units formed integrally together. Each of the plurality of individual housing units has a plurality of surface mountable socket contacts for receiving corresponding pins of a surge protector module. A single and/or multi-layer printed circuit board is provided with a plurality of solder pads for electrical connection to corresponding ones of the plurality of surface mountable socket contacts. An input connector socket is formed on the printed circuit board for receiving incoming tip and ring lines. An output connector socket is also formed on the printed circuit board for receiving outgoing tip and ring lines.

The printed circuit board is provided with a plurality of layers and has a plurality of conductive traces formed on the plurality of layers. Certain ones of the plurality of conductive traces establish electrical connections between corresponding ones of the solder pads and the input connector socket. Certain other ones of the plurality of conductive traces establish electrical connection between corresponding other ones of the solder pads and the output connector socket.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
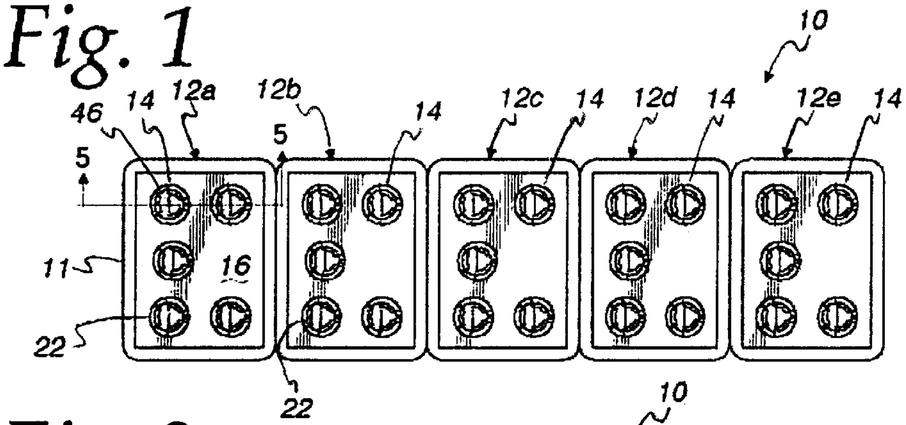
FIG. 1 is a top plan view of a surge protector block assembly for use with a single and/or multi-layer printed circuit board, constructed in accordance with the principles of the present invention.
Figure 2:
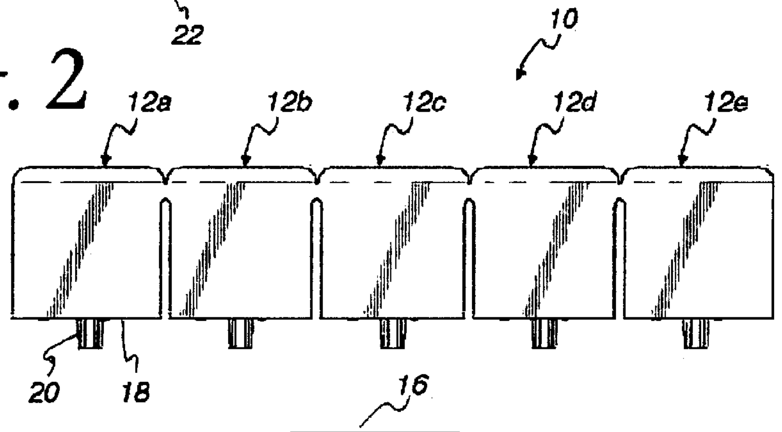
FIG. 2 is a side elevational view of the surge protector block assembly of FIG. 1.
Figure 4:
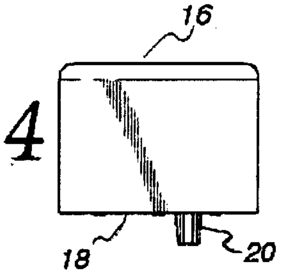
FIG. 4 is a left end view of the surge protector block assembly of FIG. 1.

It is to be distinctly understood at the outset that the present invention shown in the drawings and described in detail in conjunction with the preferred embodiment is not intended to serve as a limitation upon the scope or teachings thereof, but is to be considered merely as an exemplification of the principles of the present invention.

Referring now in detail to the drawings, there is shown in FIGS. 1 through 5 a surge protector block assembly 10 for coupling a plurality of surge protector modules (not shown) to multi-line telecommunications cables, constructed in accordance with the principles of the present invention. The surge protector block assembly 10 is comprised of five individual 5-pin housing units 12*a*–12*e* which are formed integrally together in a laterally spaced-apart relationship. Each of the individual housing units 12*a*–12*e* is preferably made from a suitable plastic insulating material and the like. Since each of the housing units 12*a*–12*e* is identical in its construction, it is believed sufficient to describe in detail only one of them, such as housing unit 12*a*.

Figure 5:
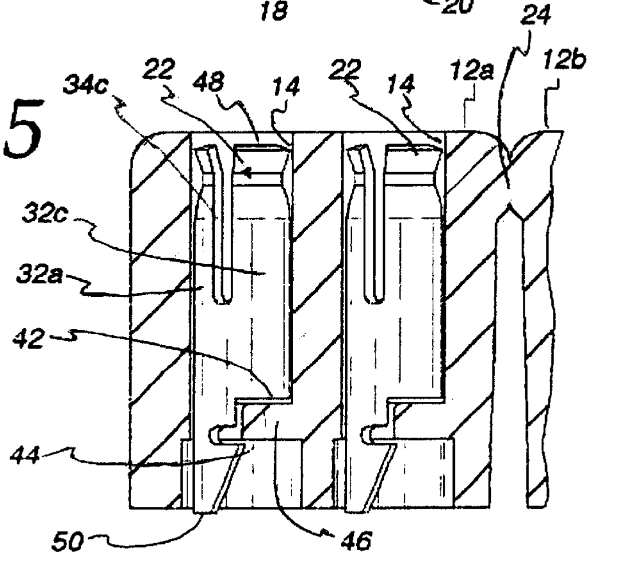
FIG. 5 is a cross-sectional view, taken along the lines 5—5 of FIG. 1.
Figure 3:
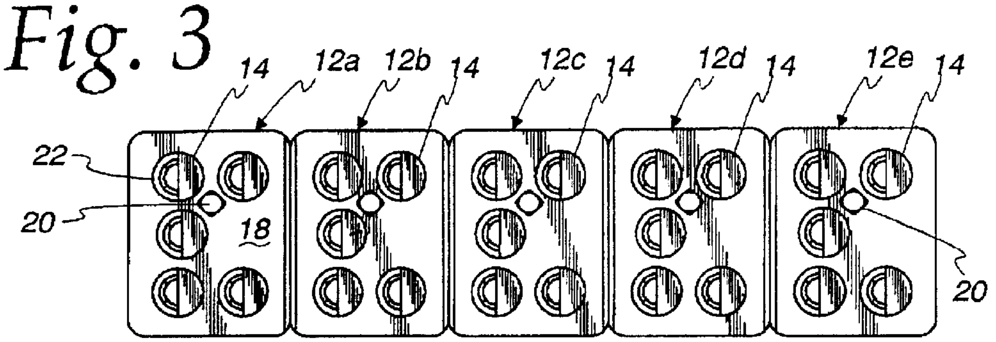
FIG. 3 is a bottom plan view of the surge protector block assembly of FIG. 1.

As can best be seen in FIGS. 1, 3 and 5, the housing unit 12*a* is formed of a rectangularly-shaped housing or enclosure 11 and includes a plurality of openings or holes 14 formed therethrough which extend from its top surface 16 to its bottom surface 18. While the plurality of holes 14 are arranged in a generally C-shaped configuration (FIG. 1), it should be clearly understood that the configuration can be of any shape dependent upon the lay-out of the pins formed on the surge protector modules being used therewith. The bottom surface 18 of the housing unit 12*a* is formed with a mounting post 20 which is used to locate and position the housing unit 12*a* with respect to a single and/or multi-layer printed circuit board, as will be described more fully hereinafter.

A tubular-shaped surface mountable socket contact 22 is preferably formed of a metallic material such as a copper alloy and is inserted into each of the corresponding ones of the plurality of holes 14 of the housing unit 12*a*. Each pin of the surge protector module fits into one of these surface mountable socket contacts 22 and forms with the socket contacts a compression fit so as to establish a good electrical connection. A plurality of such surge protector modules may be similarly inserted into the corresponding socket contacts 22 mounted in the other individual housing units 12*b* through 12*d* of the protector block assembly 10.

As was previously mentioned, the conventional surge protector module in an industrial standard configuration has five (5) pins. Two of the five pins are connected to each of the incoming tip and ring lines. Two of the other five pins are also connected to each of the outgoing tip and ring lines. The remaining pin is connected to a ground potential.

Figure 6:
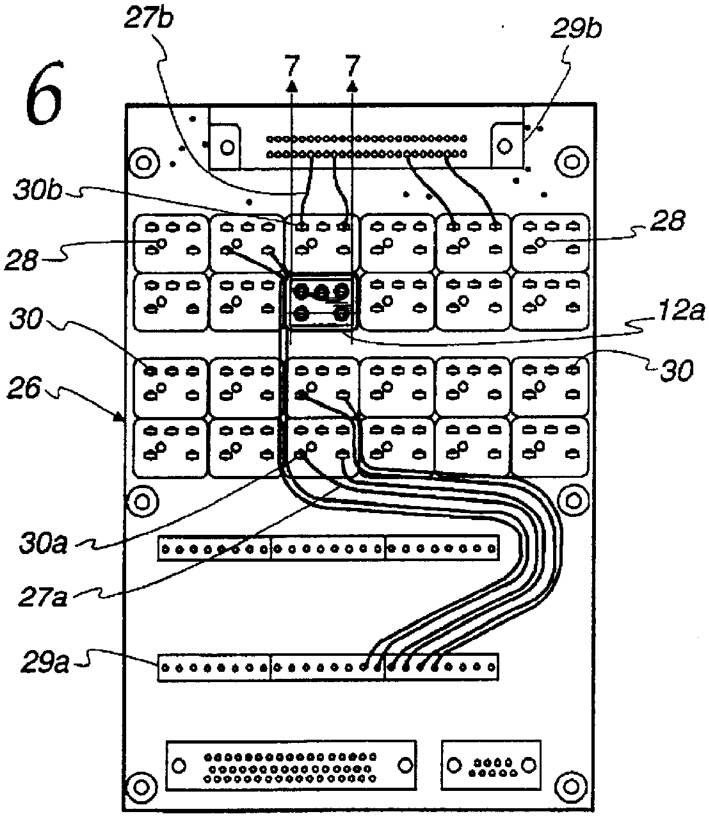
FIG. 6 is a top plan view of a single and/or multi-layer printed circuit board having one housing unit mounted thereon in accordance with the present invention.

With reference to FIG. 6, there is illustrated one of the individual housing units 12*a*–12*e*, such as unit 12*a* of FIG. 1, which has been easily severed or broken apart at junction 24 (FIG. 2) so as to be separated from the surge protector block assembly 10 and which has been surface mounted onto a single and/or multi-layer printed circuit board 26. The single and/or multi-layer printed circuit board 26 includes a drilled hole 28 for receiving the mounting post 20 of the individual housing unit 12*a* so as to locate and position the unit with respect to the printed circuit board. The single and/or multi-layer printed circuit board 26 also includes a plurality of solder pads 30 which are aligned so as to contactly engage with the lower ends of the surface mountable socket contacts 22.

The multi-layer printed circuit board 26 is fabricated from multiple layers of a dielectric material such as fiber-glass which are then bound together. Each layer of the multi-layer printed circuit board is manufactured with a predetermined pattern of a plurality of metal conductive traces. Each of the conductive traces is used to provide a unique, low resistant electrical connection between one of the solder pads 30 and a corresponding one of the pins on either an input or output connector socket. The input connector socket is connectable to a cable having a plurality of incoming tip and ring telephone lines. The output connector socket is connectable to a cable having a plurality of outgoing tip and ring telephone lines. For example, the conductive trace 27*a* is used to form an electrical connection between the solder pad 30*a* and one pin on an input connector socket 29*a*. Similarly, the conductive trace 27*b* is used to form an electrical connection between the solder pad 30*b* and one pin on an output connector socket 29*b*.

Figure 7:
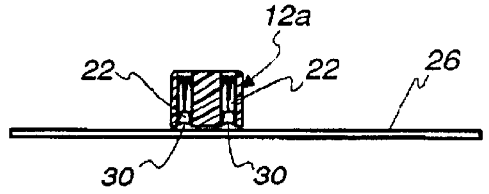
FIG. 7 is a cross-sectional view, taken along the lines 7—7 of FIG. 6.
Figure 8:
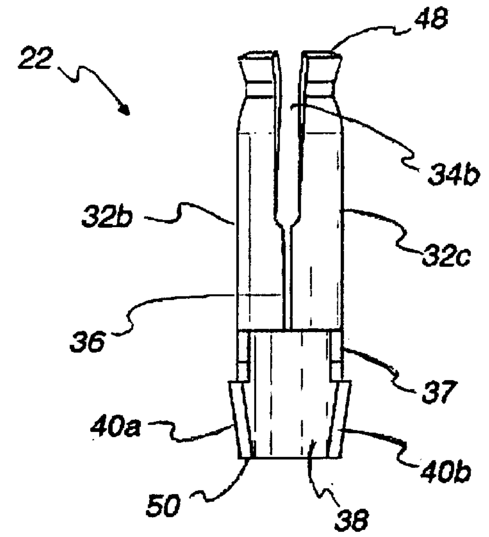
FIG. 8 is a front plan view of one of the surface mountable socket contacts of the present invention.
Figure 9:
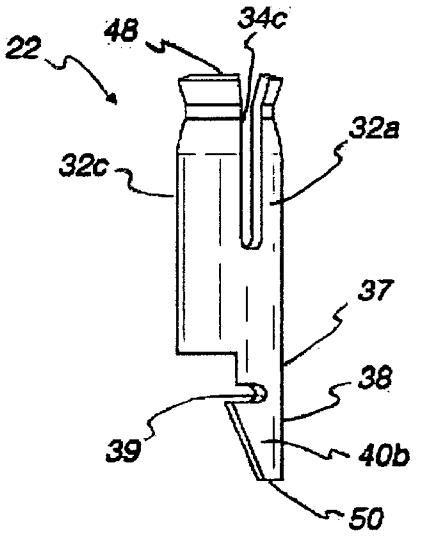
FIG. 9 is a right side view of the socket contact of FIG. 8.
Figure 10:
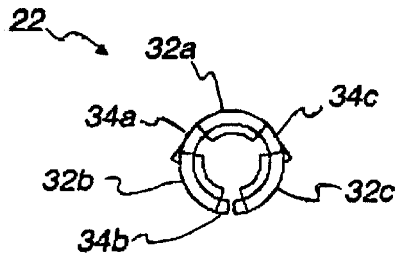
FIG. 10 is a top plan view of the socket contact of FIG. 8.
Figure 11:
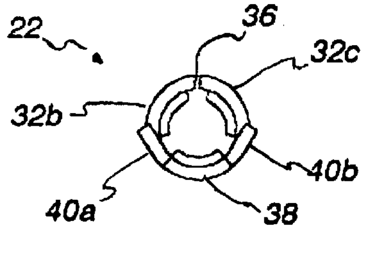
FIG. 11 is a bottom plan view of the socket contact of FIG. 8.

As will be noted in FIG. 7 of the drawings, each of the surface mountable socket contacts 22 of the housing unit 12*a* is attached electrically to the top surface of the single and/or multi-layer printed circuit board 26 via the solder pads 30 by using a reflow solder process or the like. It will be appreciated that the lower ends of the socket contacts 22 are substantially flush with the bottom surface or side of the individual housing unit 12*a* so as to be surface mountable onto the printed circuit board 26.

Unlike the prior art surge protector block assembly which is mounted to a multi-layer printed circuit board having a plurality of sockets or plated-through holes, the present invention allows the amount of space required for mounting the present surge protector block assembly to be reduced. Further, the instant invention will have less inductance effect at high frequencies due to the elimination of the plated-through holes.

The surface mountable socket contacts 22 shown generally in FIGS. 1, 3 and 5 are all identical and one of them is depicted in full detail in FIGS. 8 through 11. The upper section of the socket contacts 22 is formed of three equally-spaced arcuate members 32*a*, 32*b* and 32*c* which are separated by a corresponding one of a plurality of U-shaped slits 34*a*, 34*b* and 34*c*. Below the U-shaped slit 34*b*, the arcuate members 32*b* and 32*c* are separated by a small gap 36. Extending downwardly and formed integrally with the lower portion of the arcuate member 32*a*, there is provided a bight portion 37. The bight portion 37 is connected integrally on its lower end to a semi-cylindrical member 38 via a small C-shaped portion 39. The semi-cylindrical member 38 is formed with opposed flared end portions 40*a* and 40*b*.

During assembly, twenty-five of the surface mountable socket contacts 22 are inserted into the corresponding openings 14 formed in the five 5-pin housing units 12*a*–12*b* so as to form the completely finished surge protector assembly illustrated in FIG. 1. As will be noted from FIG. 5, the bottom surfaces 42 of the arcuate members 32*b* and 32*c* will come to rest against the top surface 44 of a semi-circular ledge 46, which acts as a stop member, formed in the opening 14. As a result, the top surface 48 of the arcuate members will be disposed slightly below the top surface 16 of the housing unit 12*a*. On the other hand, the bottom surface of the semi-circular member 38 will be substantially flush with the bottom surface or side 18 of the housing unit 12*a*. However, in practice, the bottom surface 50 of the member 38 will extend slightly below the bottom surface 18 so as to facilitate surface mounting of the housing unit 12*a* to the single and/or multi-layer printed-circuit board 26, as shown in FIGS. 6 and 7.

From the foregoing detailed description, it can thus be seen that the present invention provides an improved surge protector block assembly which includes a plurality of individual 5-pin housing units formed integrally together. Each of the plurality of individual housing units has a plurality of surface mountable socket contacts for receiving corresponding pins of a surge protector module. A single and/or multi-layer printed circuit board is provided with a plurality of solder pads for electrical connection to corresponding ones of the plurality of surface mountable socket contacts.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A surge protector block assembly comprising, in combination:

a plurality of individual 5-pin housing units formed integrally together;

each of said plurality of individual housing units having a plurality of tubularly-shaped surface mountable socket contacts for receiving corresponding pins of a surge protector module;

a multi-layer printed circuit board having a plurality of solder pads for electrical connection to corresponding ones of said plurality of tubularly-shaped surface mountable socket contacts;

an input connector socket formed on said printed circuit board for receiving incoming tip and ring lines;

an output connector socket formed also on said printed circuit board for receiving outgoing tip and ring lines;

said printed circuit board having a plurality of layers and a plurality of conductive traces formed on said plurality of layers, certain ones of said plurality of conductive traces establishing electrical connection between corresponding ones of said solder pads and said input connector socket, certain other ones of said plurality of conductive traces establishing electrical connection between corresponding other ones of said solder pads and said output connector socket; and each of said plurality of surface mountable socket contacts having an upper section which is formed of first, second and third equally-spaced arcuate members separated by corresponding ones of first, second and third U-shaped slits, said first arcuate member having its lower portion joined integrally to one end of a bight portion, the other end of said bight portion being connected integrally to a semi-cylindrical member via a small C-shaped portion, said semi-cylindrical portion being formed with opposed flared end portions, said corresponding one of the U-shaped slits separating said second and third arcuate members being formed with a gap extending thereunder.

2. A surge protector block assembly as claimed in claim 1, wherein each of said plurality of surface mountable socket contacts is formed of a copper alloy material.

3. A surge protector block assembly as claimed in claim 1, wherein each of said plurality of individual housing units is formed of a plastic insulating material.

4. A surge protector block assembly as claimed in claim 1, wherein each of said plurality of individual housing units is formed with a mounting post for positioning said housing units with respect to a drilled hole formed in said printed circuit board.

5. A surge protector block assembly as claimed in claim 1, wherein the top surfaces of said plurality of surface mountable socket contacts are disposed slightly below the top surface of said housing units.

6. A surge protector block assembly as claimed in claim 1, wherein the bottom surfaces of said plurality of surface mountable socket contacts extend slightly below the bottom surface of said housing units so as to facilitate surface mounting of said housing units to the multi-layer printed circuit board.

7. A surge protector block assembly comprising:

a plurality of individual housing units formed integrally together;

each of said plurality of individual housing units having a plurality of tubularly-shaped surface mountable socket contacts for receiving corresponding pins of a surge protector module;

a printed circuit board having a plurality of solder pads for electrical connection to corresponding ones of said plurality of tubularly-shaped surface mountable contacts; and each of said plurality of surface mountable socket contacts having an upper section which is formed of first, second and third equally-spaced arcuate members separated by corresponding ones of first, second and third U-shaped slits, said first arcuate member having its lower portion joined integrally to one end of a bight portion, the other end of said bight portion being connected integrally to a semi-cylindrical member via a small C-shaped portion, said semi-cylindrical portion being formed with opposed flared end portions, said corresponding one of the U-shaped slits separating said second and third arcuate members being formed with a gap extending thereunder.

8. A surge protector block assembly as claimed in claim 7, wherein each of said plurality of surface mountable socket contacts is formed of a copper alloy material.

9. A surge protector block assembly as claimed in claim 7, wherein the top surfaces of said plurality of surface mountable socket contacts are disposed slightly below the top surface of said housing units.

10. A surge protector block assembly as claimed in claim 7, wherein the bottom surfaces of said plurality of surface mountable socket contacts extend slightly below the bottom surface of said housing units so as to facilitate surface mounting of said housing units to the printed circuit board.

11. A surge protector block assembly comprising, in combination:

a plurality of individual 5-pin housing units formed integrally together;

each of said plurality of individual housing units having a plurality of tubularly-shaped surface mountable socket contacts for receiving corresponding pins of a surge protector module;

a printed circuit board having a plurality of solder pads for electrical connection to corresponding ones of said plurality of tubularly-shaped surface mountable socket contacts;

an input connector socket formed on said printed circuit board for receiving incoming tip and ring lines;

an output connector socket formed also on said printed circuit board for receiving outgoing tip and ring lines;

said printed circuit board having a plurality of conductive traces, certain ones of said plurality of conductive traces establishing electrical connection between corresponding ones of said solder pads and said input connector socket, certain other ones of said plurality of conductive traces establishing electrical connection between corresponding other ones of said solder pads and said output connector socket; and each of said plurality of surface mountable socket contacts having an upper section which is formed of first, second and third equally-spaced arcuate members separated by corresponding ones of first, second and third U-shaped slits, said first arcuate member having its lower portion joined integrally to one end of a bight portion, the other end of said bight portion being connected integrally to a semi-cylindrical member via a small C-shaped portion, said semi-cylindrical portion being formed with opposed flared end portions, said corresponding one of the U-shaped slits separating said second and third arcuate members being formed with a gap extending thereunder.

* * * * *